United States Patent
Yu et al.

(10) Patent No.: US 11,177,355 B2
(45) Date of Patent: Nov. 16, 2021

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chen-Hua Yu, Hsinchu (TW); Mirng-Ji Lii, Hsinchu County (TW); Hung-Yi Kuo, Taipei (TW); Hao-Yi Tsai, Hsinchu (TW); Tsung-Yuan Yu, Taipei (TW); Min-Chien Hsiao, Taichung (TW); Chao-Wen Shih, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 16/379,442

(22) Filed: Apr. 9, 2019

(65) Prior Publication Data

US 2019/0237553 A1    Aug. 1, 2019

Related U.S. Application Data

(62) Division of application No. 14/529,772, filed on Oct. 31, 2014, now Pat. No. 10,269,904.

(51) Int. Cl.
*H01L 23/52* (2006.01)
*H01L 29/40* (2006.01)
(Continued)

(52) U.S. Cl.
CPC .......... *H01L 29/402* (2013.01); *H01L 21/765* (2013.01); *H01L 23/5223* (2013.01);
(Continued)

(58) Field of Classification Search
CPC ............... H01L 29/402; H01L 23/5223; H01L 23/5227; H01L 21/765; H01L 23/562; H01L 23/525; H01L 2224/0401; H01L 2224/05022; H01L 2224/05548; H01L 2224/05567; H01L 24/05; H01L 2224/05624; H01L 2224/05639; H01L 2224/05644; H01L 2224/05647;
(Continued)

(56) References Cited

U.S. PATENT DOCUMENTS

2009/0121322 A1* 5/2009 Ozawa .................. H01L 23/585
257/620
2010/0148304 A1* 6/2010 Rahim ................ H01L 27/0805
257/532

(Continued)

*Primary Examiner* — Samuel Park
(74) *Attorney, Agent, or Firm* — WPAT, P.C., Intellectual Property Attorneys; Anthony King

(57) ABSTRACT

The present disclosure provides a semiconductor structure. The semiconductor structure includes a circuit region, a seal ring region and an assembly isolation region. The circuit region includes a first conductive layer. The seal ring region includes a second conductive layer. The assembly isolation region is between the circuit region and the seal ring region. The first conductive layer and the second conductive layer respectively include a portion extending into the assembly isolation region thereby forming an electric component in the assembly isolation region.

20 Claims, 19 Drawing Sheets

(51) Int. Cl.
  *H01L 21/765* (2006.01)
  *H01L 23/522* (2006.01)
  *H01L 23/00* (2006.01)
  *H01L 23/525* (2006.01)

(52) U.S. Cl.
  CPC ........ *H01L 23/5227* (2013.01); *H01L 23/525* (2013.01); *H01L 23/562* (2013.01); *H01L 24/05* (2013.01); *H01L 2224/0401* (2013.01); *H01L 2224/05022* (2013.01); *H01L 2224/05548* (2013.01); *H01L 2224/05567* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05684* (2013.01); *H01L 2224/10126* (2013.01)

(58) Field of Classification Search
  CPC . H01L 2224/05655; H01L 2224/05684; H01L 2224/10126; H01L 23/564; H01L 22/32; H01L 23/5525; H01L 23/66; H01L 24/48; H01L 1123/66; H01L 29/0623; H01L 29/7811; H01L 29/7823; H01L 2924/00014; H01L 2924/00; H01L 2924/0002; H01L 23/585; H01L 2224/48091; H01L 2224/32225; H01L 2924/14; H01L 2224/45099; H01L 2224/73265; H01L 2924/13091; H01L 2224/48227; H01L 2924/00012; H01L 2924/01029; H01L 2224/05599; H01L 2924/10253; H01L 2224/05552; H01L 2924/12042; H01L 2924/01033; H01L 2924/181; H01L 2924/3011; H01L 2224/45015; H01L 2224/48145; H01L 28/10; H01L 21/68721; H01L 2224/05352
  See application file for complete search history.

(56) References Cited

U.S. PATENT DOCUMENTS

| | | | |
|---|---|---|---|
| 2010/0200921 A1* | 8/2010 | Fuchigami | H01L 29/78 257/358 |
| 2013/0302952 A1* | 11/2013 | Luo | H01L 21/28518 438/163 |
| 2015/0214255 A1* | 7/2015 | Chikama | H01L 29/45 257/43 |

* cited by examiner

SEMICONDUCTOR STRUCTURE AND MANUFACTURING METHOD THEREOF

CROSS REFERENCE TO RELATED APPLICATIONS

This application is a divisional application to U.S. non-provisional application Ser. No. 14/529,772, filed Oct. 31, 2014, and claims priority thereto.

BACKGROUND

Presently, electronic equipment is essential for many modern applications. Therefore, consumers are increasingly demanding more processing power, lower electrical power usage and cheaper devices. As the electronic industry strives to meet these demands and more complicated and denser configurations, miniaturization will result in an extension of the number of chips per wafer and the number of transistors per chip, as well as a reduction in power usage. Wafer level packaging (WLP) technology has been gaining popularity since the electronic components are being designed to be lighter, smaller, more multifunctional, more powerful, more reliable and less expensive. The WLP technology combines dies having different functionalities at a wafer level, and is widely applied in order to meet continuous demands toward the miniaturization and higher functions of the electronic components.

A substrate in WLP technology raises concerns about how to increase the number of the electric components, especially at the peripheral region of such substrate. In contrast to a traditional packaging technology, the electric components on the substrate with WLP technology are too crowded to locate any more components in peripheral region of the substrate. Thus, improvements in the method for a WLP continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION

Figure 1:
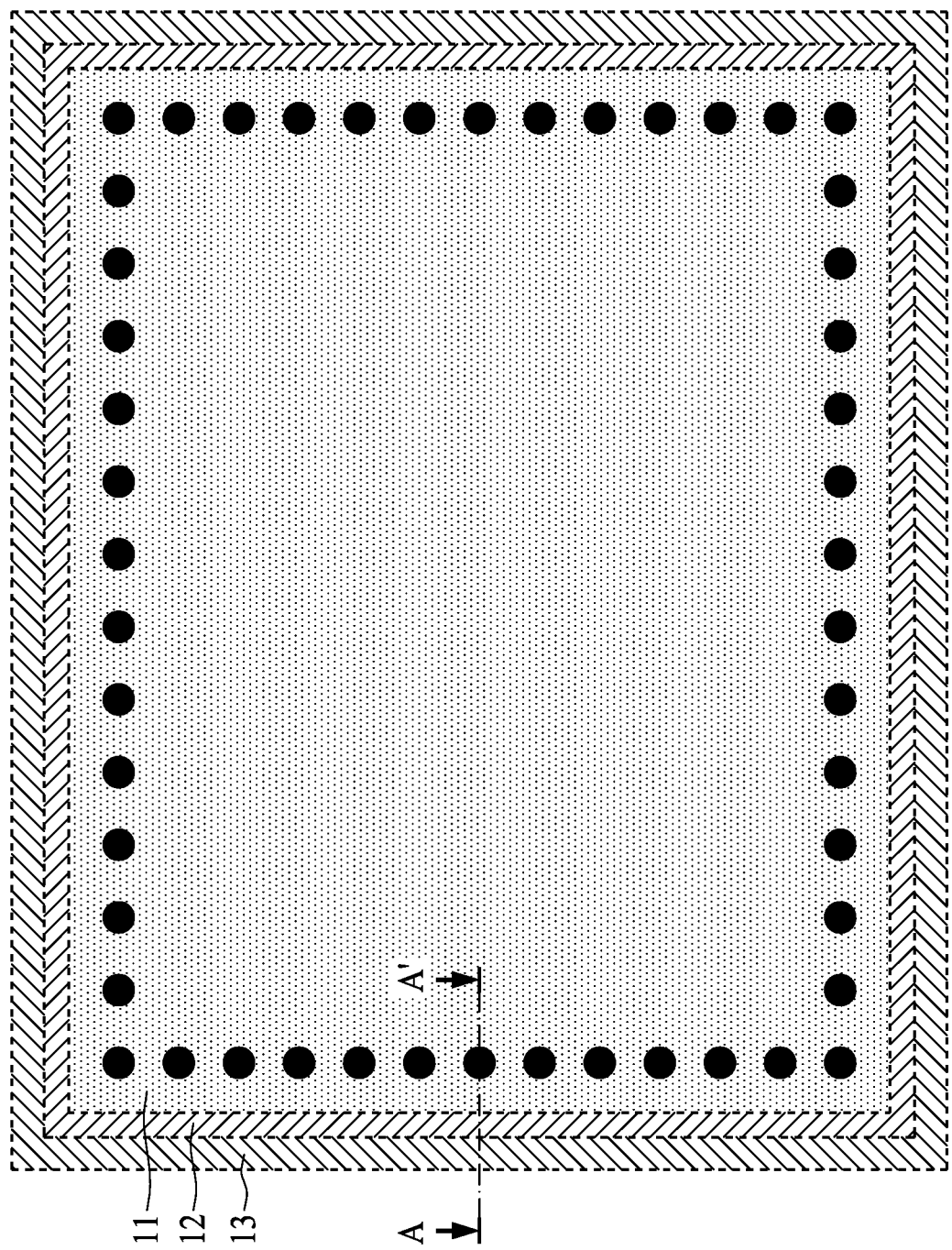
FIG. 1 is a top view of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In the present disclosure, routing additional traces, which conducts electric current, enables a formation of additional electric components. A semiconductor device includes a circuit region, a seal ring region, and an assembly isolation region between the circuit region and the seal ring region. Those traces in the circuit region and the seal ring region are rerouted or extended into the assembly isolation region so as to form several electric components in the assembly isolation region. Thus, extending the number of the electric components, especially at peripheral region of the substrate, is available.

In various embodiments, the traces respectively extended from the circuit region and the seal ring region interlace with each other so as to form an electric component, such as a capacitor. In some embodiments, those traces are electrically connected with each other so as to form an alternative component such as an inductor at peripheral region of the substrate. Thus, the number of the electric components extends at peripheral substrate for different applications.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additionally integrated circuits. In some embodiments, the bulk substrate includes a wafer such as a polished wafer, an epi wafer, an argon anneal wafer, a hai wafer and a silicon on insulator (SOI) wafer.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

As used herein, a "mask layer" recited in the present disclosure is an object of a patterning operation. The patterning operation includes various steps and operations and varies in accordance with features of embodiments. In some embodiments, a patterning operation patterns an existing film or layer. The patterning operation includes forming a mask on the existing film or layer and removing the unmasked portion of the film or layer with an etch or other removal operations. The mask layer is a photo resist or a hardmask. In some embodiments, a patterning operation directly forms a patterned layer on a surface. The patterning operation includes forming a photosensitive film on the surface, conducting a photolithography operation and a developing operation. The remaining photosensitive film may be removed or retained and integrated into the package.

Referring to FIG. 1, a top plan view of a semiconductor structure 10 is illustrated including an integrated circuit (IC) die at a circuit region 11 of the structure 10, a seal ring region 13, and an assembly isolation region 12 therebetween according to various aspects of the present disclosure. Alternative cross-sectional views of the structure 10 along line A-A' are illustrated in FIGS. 2 to 8 according to embodiments of the present disclosure.

Figure 2:
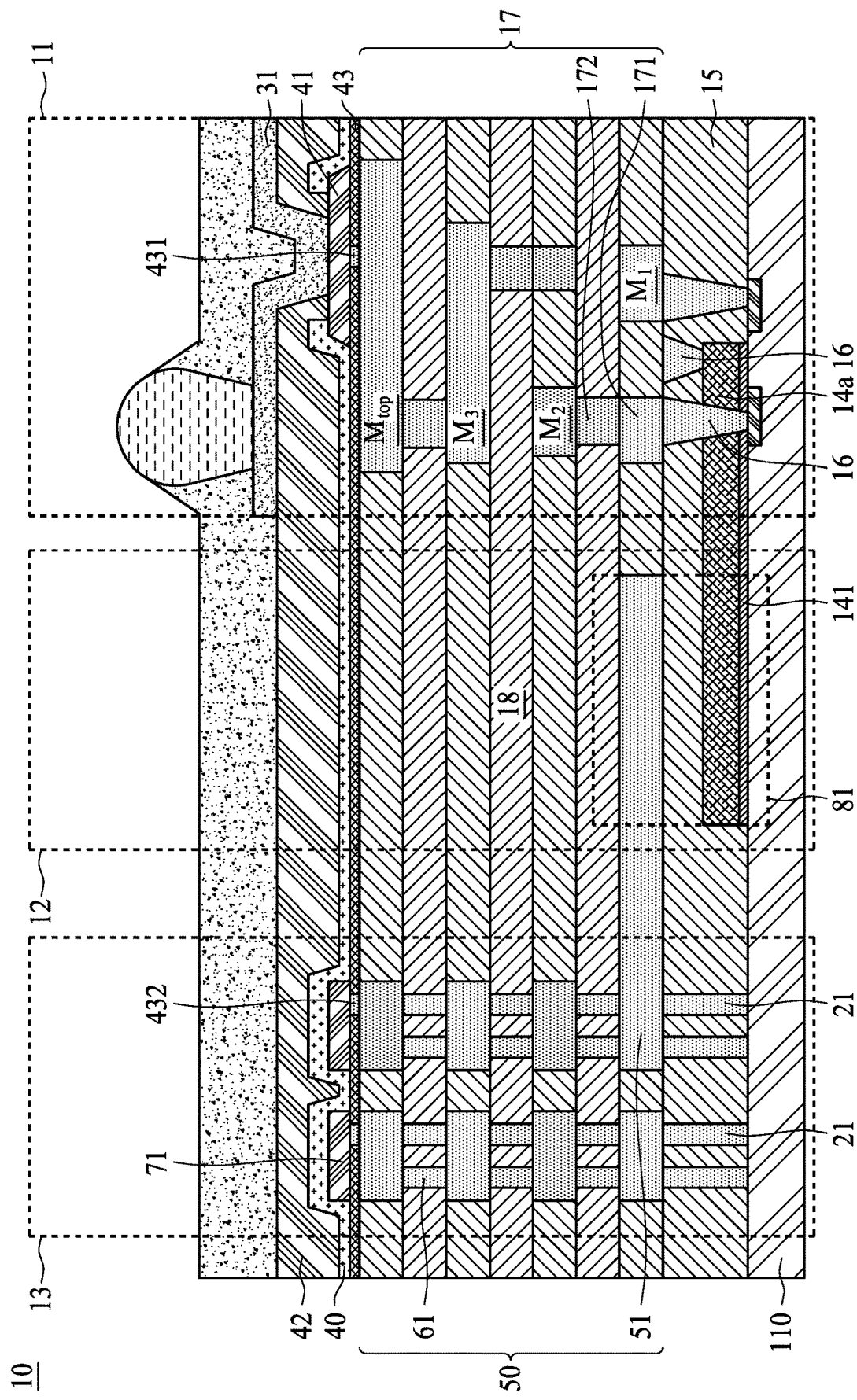
FIG. 2 is a cross-sectional view of a semiconductor structure according to some embodiments of the present disclosure.

Referring now to FIG. 2 in conjunction with FIG. 1, a cross-sectional view is illustrated of an embodiment of semiconductor structure 10. The semiconductor structure 10 includes a semiconductor substrate 110 such as a silicon substrate (e.g., a p-doped substrate or an n-doped substrate) locating at the seal ring region 13, the assembly isolation region 12 and the circuit region 11. In some embodiments, the seal ring region 13 is formed around the circuit region 11, and the seal ring region 13 is for forming a seal ring structure thereon and the circuit region 11 is for forming at least a transistor device therein.

The substrate 110 includes silicon germanium, gallium arsenic, or other suitable semiconductor materials. The substrate 110 further includes doped regions, such as a P-well, an N-well, and/or a doped active region such as a P+ doped active region. The substrate 110 may further include other features such as a buried layer, and/or an epitaxy layer. Furthermore, the substrate 110 may be a semiconductor on insulator such as silicon on insulator (SOI). In other embodiments, the semiconductor substrate 110 may include a doped epitaxy layer, a gradient semiconductor layer, and/or may further include a semiconductor layer overlying another semiconductor layer of a different type such as a silicon layer on a silicon germanium layer. In some embodiments, the substrate 110 may include a multilayer silicon structure or a silicon substrate may include a multilayer compound semiconductor configuration.

The semiconductor structure 10 further includes dummy gate or gate layer 14a overlying the substrate 110, and the gate layer 14a is formed from various material layers and by various etching/patterning techniques. The gate layer 14a is made of semiconductive materials such as polysilicon, silane ($SiH_4$), di-silane ($Si_2H_6$), or di-clorsilane ($SiCl_2H_4$) so as to be operated as a conductive layer under certain condition.

In some embodiments, an insulator layer 141, including a high k dielectric layer and/or a barrier layer, is formed between the substrate 110 and the gate layer 14a. The insulator layer 141 may be a dummy dielectric layer formed on the substrate 110. The insulator layer 141 is made of dielectric materials such as silicon dioxide ($SiO_2$), phosphorus pentoxide ($P_4O_{10}$), selenium dioxide ($SeO_2$), sulfur trioxide ($SO_3$) or metal oxide. Examples of the metal oxide are selected from zinc oxide (ZnO), aluminium oxide ($Al_2O_3$), iron (II,III) oxide ($Fe_3O_4$), calcium oxide (CaO), ruthenium tetroxide ($RuO_4$), osmium (VIII) oxide ($O_3O_4$), iridium tetroxide ($IrO_4$), indium tin oxide ($In_2O_3$:$SnO_2$), xenon tetroxide ($XeO_4$), nickel oxide, titanium oxide, hafnium oxide, zirconium oxide, tungsten oxide, tantalum oxide, molybdenum oxide and copper oxide.

Contact plugs 16 are formed in an inter-layer dielectric (ILD) 15 and electrically coupled to the gate layer 14a in the circuit region 11. The contact plugs 16 are made of conductive materials such as Aluminum (Al), Chromium (Cr), Gold (Au), Molybdenum (Mo), Platinum (Pt), Tantalum (Ta), Titanium (Ti), Silver (Ag), Copper (Cu), Tungsten (W) and/or alloy thereof.

The semiconductor structure 10 further includes contact bars 21, which are formed in the ILD 15 in the seal ring region 13. The contact bar 21 is electrically coupled between an active region on the substrate 110 and a seal ring structure 50 above the contact bar 21. The contact bars 21 are formed of conductive materials such as Aluminum (Al), Chromium (Cr), Gold (Au), Molybdenum (Mo), Platinum (Pt), Tantalum (Ta), Titanium (Ti), Silver (Ag), Copper (Cu), Tungsten (W) and/or alloy thereof.

In some embodiments, the seal ring structure 50 in the seal ring region 13 includes various stacked conductive layers 51 and via layers 61 disposed through inter-metal dielectrics (IMDs) 18. Those conductive layers 51 and via layers 61 allow to conduct electric currents. The conductive layers 51 and via layers 61 may include current conducting traces therein. These traces are made of semiconductive or conductive material. For example, traces are formed of semiconductive materials such as polysilicon, silane ($SiH_4$), di-silane ($Si_2H_6$), or di-clorsilane ($SiCl_2H_4$) so as to be operated as a conductive layer under certain condition. Alternatively, traces may be made of conductive materials such as Aluminum (Al), Chromium (Cr), Gold (Au), Molybdenum (Mo), Platinum (Pt), Tantalum (Ta), Titanium (Ti), Silver (Ag), Copper (Cu), Tungsten (W) and/or alloy thereof. In certain embodiments, the seal ring structure 50 has a width between about 5 μm and about 15 μm as well as the width of the seal ring region 13.

In some embodiments, as in FIG. 2, one of the conductive layers 51 extends from the seal ring region 13 into the assembly isolation region 12, while the gate layer 14a and the insulator layer 141 extend from the circuit region 11 into the assembly isolation region 12. In other words, the conductive layer 51 and the gate layer 14a respectively includes a portion extending into the assembly isolation region 12 thereby forming an electric component 81 in the assembly isolation region 12. ILD 15 is between the extended portions of the conductive layer 51 and the dummy gate 14a. In some embodiments, the electric component 81 is a capacitor in which two electrodes are formed by the extended portions of the conductive layer 51 and the dummy gate 14a. In some embodiments, several capacitors are formed by similar approach and further constructing some serial or parallel capacitor configuration.

Figure 3:
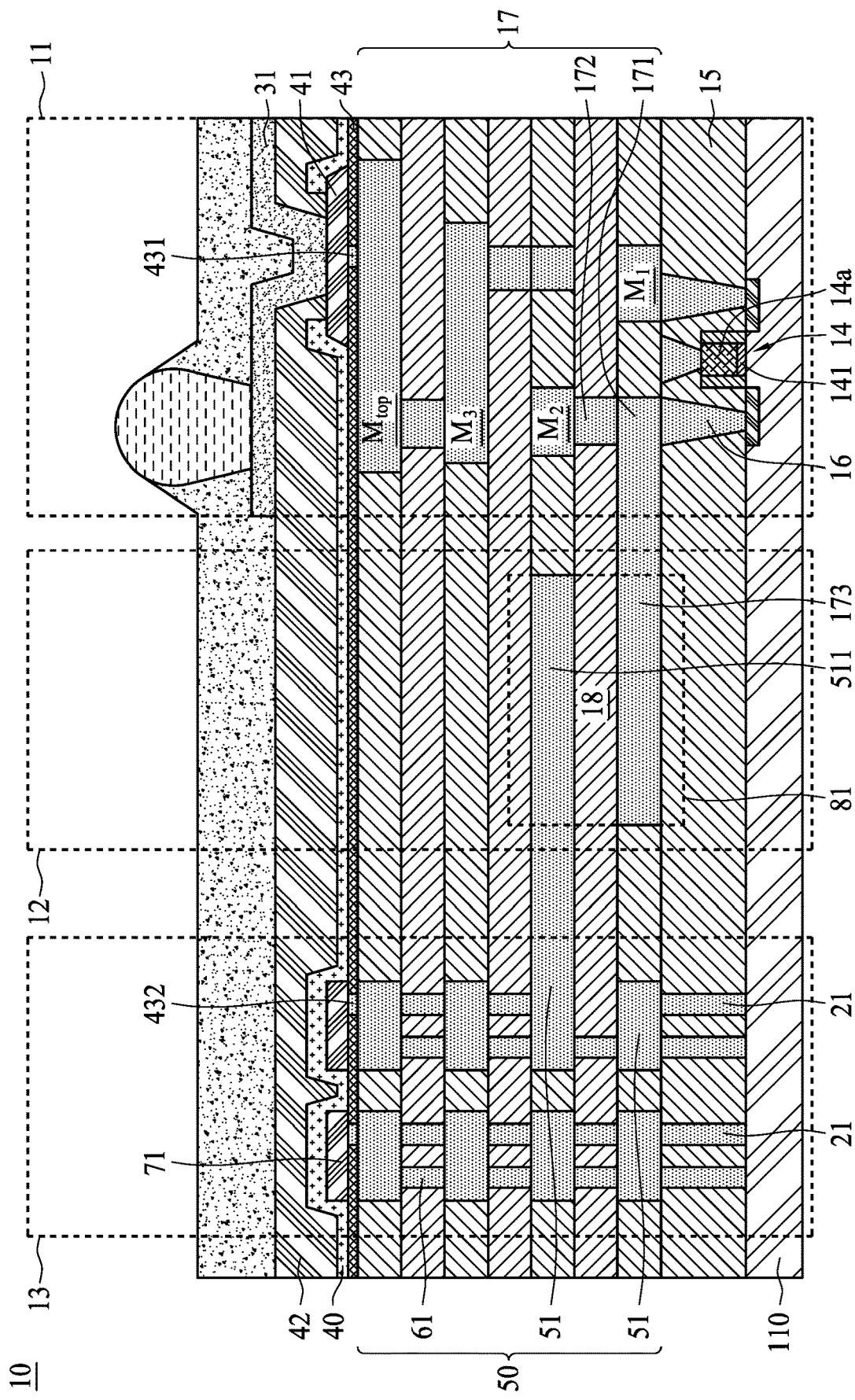
FIG. 3 is a cross-sectional view of a semiconductor structure according to certain embodiments of the present disclosure.

Referring to FIG. 3 in conjunction with FIG. 1, a cross-sectional view is illustrated of another embodiment of semiconductor structure 10. Interconnect structure 17, disposed over the contact plug 16 and the ILD 15, includes metal layers 171 and vias 172 therein. The interconnect structure 17 is electrically coupled to the gate layer 14a through the contact plug 16. Particularly, the interconnect structure 17 includes several conductive layers 171, namely $M_1$, $M_2$, ... to $M_{top}$, wherein conductive layer $M_1$ is the metal layer immediately on ILD 15, while conductive layer $M_{top}$ is the top metal layer that is under the metal pad 41. A dielectric layer 43 is disposed between the top metal layer $M_{top}$ and the metal pad 41, which are formed in subsequent operations. Via 431 is within the dielectric layer 43 for electrical coupling between the top metal layer $M_{top}$ and the metal pad 41. Conductive layers $M_1$ through $M_{top}$ are formed in IMDs 18, which are formed of oxides such as Un-doped Silicate Glass (USG), Fluorinated Silicate Glass (FSG), low-k dielectric materials, or the like. The low-k dielectric materials may have k values lower than about 3.8, although the dielectric materials of IMDs 18 may also be close to about 3.8. In some embodiments, the k values of the low-k dielectric materials are lower than about 3.0, and may be lower than about 2.5.

Conductive layers 171 and vias 172 refer to the collection of the conductive lines or current conducting traces in the same layer and hence, the conductive layers 171 and vias 172 are capable of conducting electric current. Conductive layers 171 and vias 172 are formed of substantially pure copper (for example, with a weight percentage of copper being greater than about 90 percent, or greater than about 95 percent) or copper alloys. The vias 172 are formed in the single and/or dual damascene structure. The conductive layers 171 and vias 172 may be, or may not be, substantially free from aluminum.

In some embodiments, one of the conductive layers 51, extending into the assembly isolation region 12, is electrically coupled with an extended portion 173 of the conductive layer $M_1$ to form an electric component 81 in the assembly isolation region 12. The coupling extended conductive traces in the assembly isolation region 12 may be a capacitor. The extended portion 511 of the conductive layer 51 is above the extended portion 173 of the conductive layer $M_1$ and separated by the IMD 18 located therebetween and hence, charges are stored in the electric component 81. For some embodiments, the electric component 81 is an indicator to detect the deviation of the composed elements. For example, thickness of one element, IMD 18, may affect the capacitance of the electric component 81. Therefore, the capacitance measured on the electric component 81 can reflect the thickness of the IMD 18. In some examples, greater than 0.5% deviation from IMD 18 target thickness can be detected through measuring the capacitance of electric component 81.

In some embodiments, electric component 81 is electrically coupled to a semiconductor device 14 in the circuit region 11 through the interconnect structure 17. The semiconductor device 14 is formed on the substrate 110 and may be either an NMOS device (e.g., nFET) or a PMOS device (e.g., pFET). In this case, the semiconductor structure 10 may further include isolation structures, such as shallow trench isolation (STI) features or LOCOS features formed in the substrate 110 for isolating the device 14 from other regions of the substrate 110.

Figure 4:
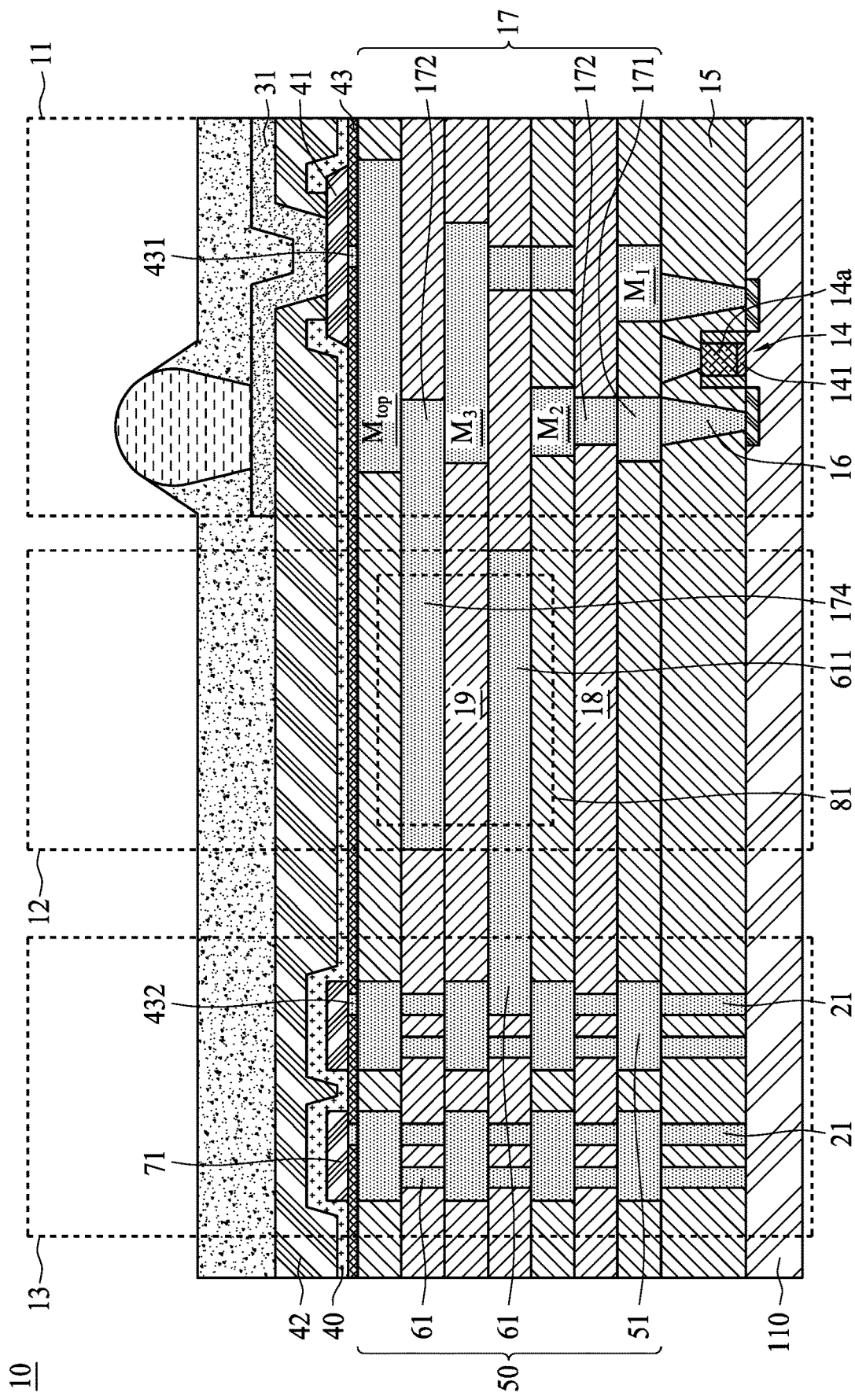
FIG. 4 is a cross-sectional view of a semiconductor structure according to another embodiments of the present disclosure.

Referring to FIG. 4 in conjunction with FIG. 1, a cross-sectional view is illustrated of another embodiment of semiconductor structure 10. One of the via layers 61 extends into the assembly isolation region 12, while one of vias 172 extends into the same region 12 to mutually form an electric component 81, such as a capacitor. The capacitor includes the extended portion 611 of the via layer 61, the extended portion 174 of the via 172, and a layer of high-k dielectric 19. Particularly, the extended portion 611 of the via layer 61 is under and separated from the extended portion 174 of the via 172 by the high-k dielectric 19. The high-k dielectric 19 materials have k values greater than about 3.9, although the dielectric materials of high-k dielectric 19 may also be from about 3.9 to about 30.

In some embodiments, the thickness of the via 172 or the via layer 61 is between about 2.0 kÅ and about 3.5 kÅ. However, since the high-k dielectric 19 is disposed between the via 172 and the via layer 61, the thickness of either the via 172 or the via layer 61 is capable of being reduced and still perform its function as well as the capacitor with original thickness. The thickness-reduced via 172 of via layer 61 have a thickness between about 1.5 kÅ and about 2.8 kÅ. In certain embodiments, the thickness of either the via 172 or the via layer 61 is between about 1.2 kÅ and about 1.8 kÅ.

Figure 5:
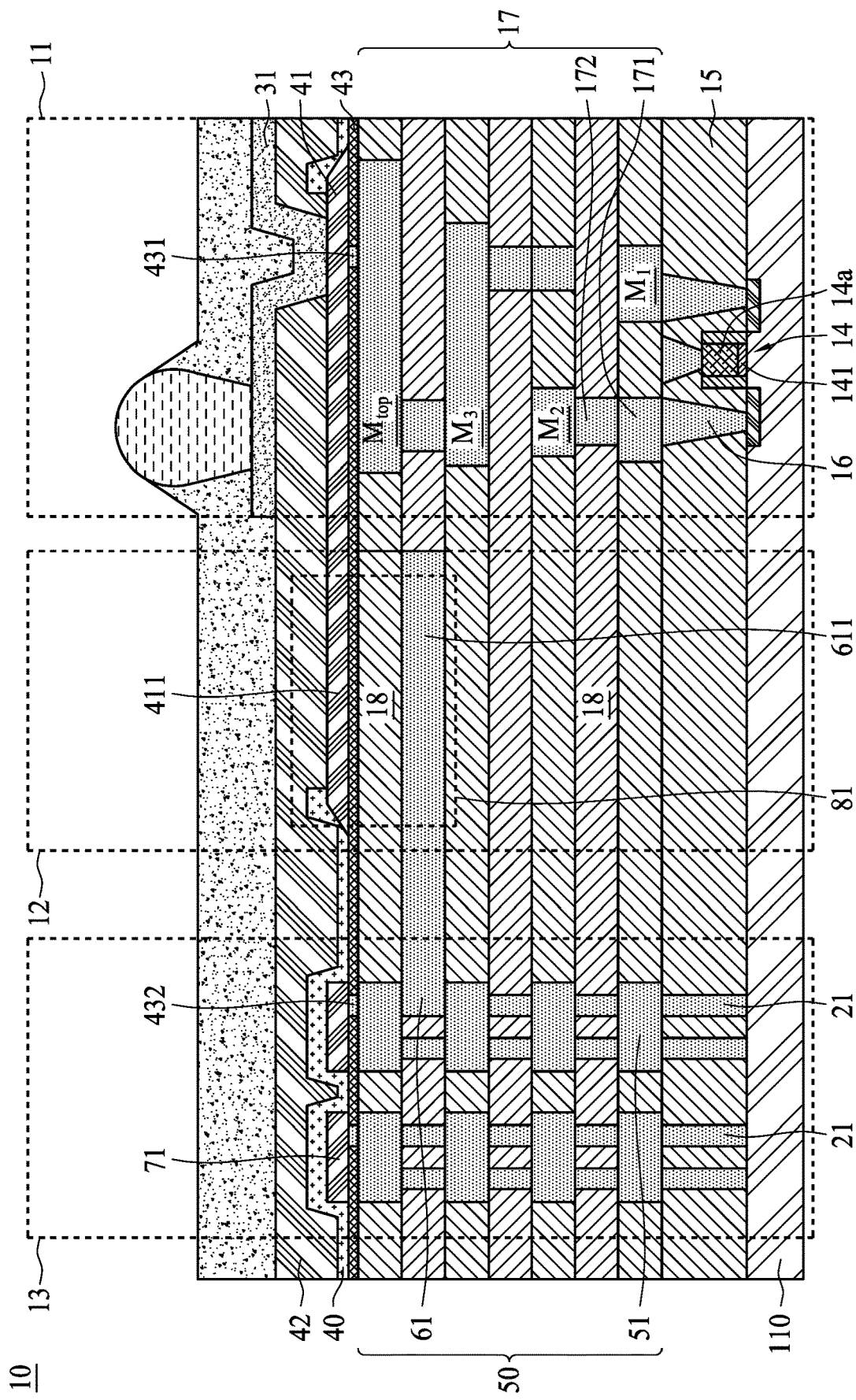
FIG. 5 is a cross-sectional view of a semiconductor structure according to other embodiments of the present disclosure.

Referring to FIG. 5 in conjunction with FIG. 1, a cross-sectional view is illustrated of another embodiment of semiconductor structure 10. A metal pad 41 is formed above the interconnect structure 17 and especially on the dielectric layer 43. A portion 411 of the metal pad 41 extends into the assembly isolation region 12. The via layer 61 extends into the assembly isolation region 12 and is separated from the metal pad 41 by the IMD 18 so as to form a passive two-terminal electric component 81 such as a capacitor. The capacitor is used to store charges. In some embodiments, the electric component 81 is electrically coupled to the contact bar 21 through the seal ring structure 50.

The metal pad 41 is electrically coupled to the semiconductor device 14, for example, through underlying interconnect structure 17. In other words, a circuit between the device 14 and the passive component 81 is formed. In certain embodiments, the metal pad 41 are formed of conductive materials such as Aluminum (Al), Chromium (Cr), Gold (Au), Molybdenum (Mo), Platinum (Pt), Tantalum (Ta), Titanium (Ti), Nickel (Ni), Silver (Ag), Copper (Cu), Tungsten (W) and/or alloy thereof.

Figure 6:
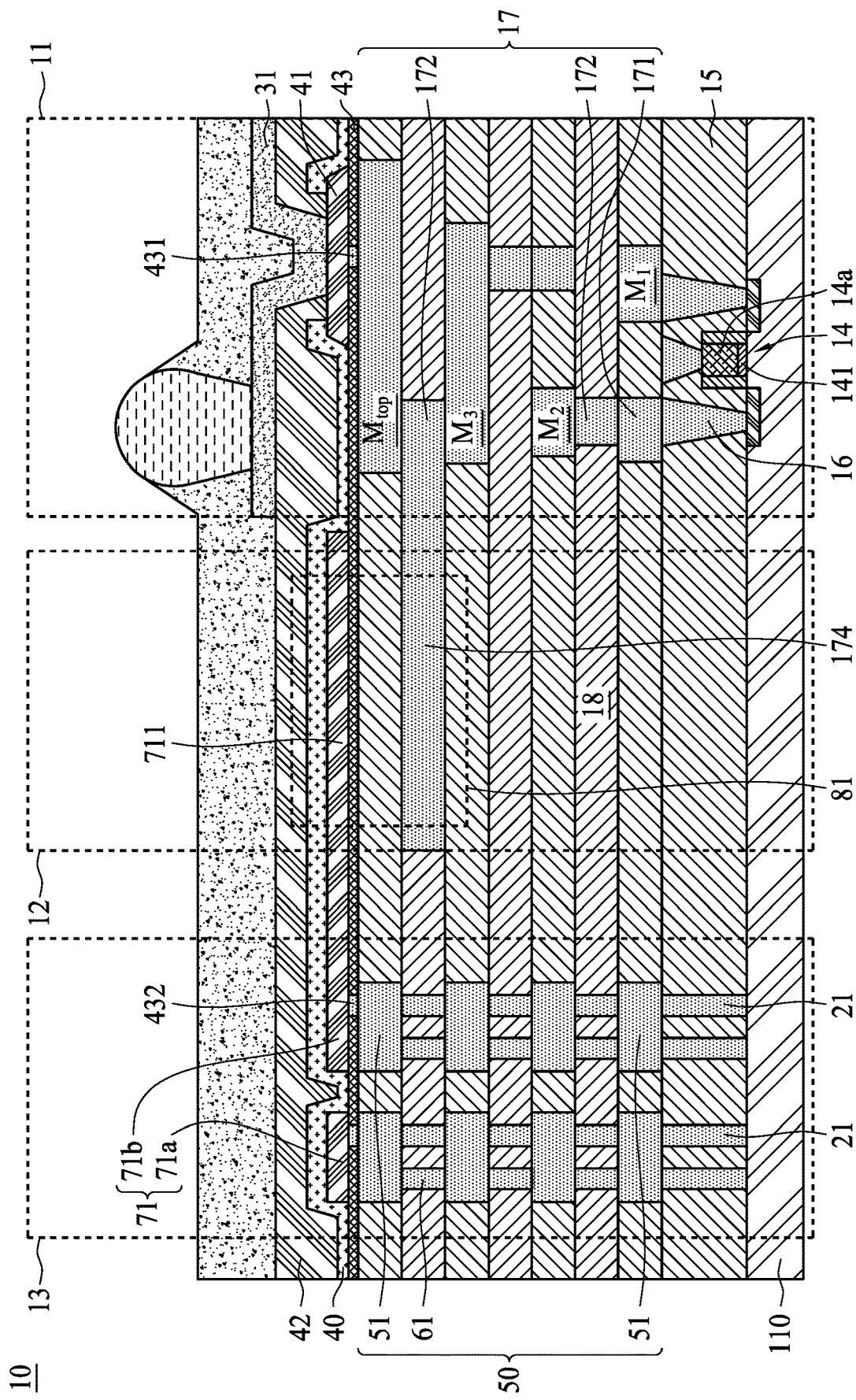
FIG. 6 is a cross-sectional view of a semiconductor structure according to some other embodiments of the present disclosure.

Referring to FIG. 6 in conjunction with FIG. 1, a cross-sectional view is illustrated of another embodiment of semiconductor structure 10. The semiconductor structure 10 further includes conductive pad 71 disposed over the dielectric layer 43 where a via 432 is disposed for electrically coupling between the conductive pad 71 and the conductive layers 51 so as to electrically couple the conductive pad 71 to the interconnect structure 17. In some embodiments, the extending portion 711 of the conductive pad 71 covers a portion 174 of the via 172 extending into the assembly isolation region 12, but does not directly contact the via 172. A layer of IMD 18 separates the conductive pad 71 from the via 172 thereby forming an electric component 81 such as a capacitor. The electric component 81 is electrically coupled to the underlying device 14 and the seal ring structure 50, respectively.

In some embodiments, the conductive pad 71 includes two portions, 71a and 71b. The portion 71a is at an exterior side of the seal ring region 13 closer to the chip edge and scribe line and the portion 71b is at an interior side of the seal ring region 13 closer to the circuit region 11. In this case, the portion 71b is rerouted into the assembly isolation region 12 so as to define the electric component 81 with the underlying portion 174 of the via 172. In addition, the portions 71a and 71b are directly covered by a passivation layer 40 to be free from moisture.

In certain embodiments, the portions 71a and 71b are formed of conductive materials such as Aluminum (Al), Chromium (Cr), Gold (Au), Molybdenum (Mo), Platinum (Pt), Tantalum (Ta), Titanium (Ti), Nickel (Ni), Silver (Ag), Copper (Cu), Tungsten (W) and/or alloy thereof.

Figure 7:
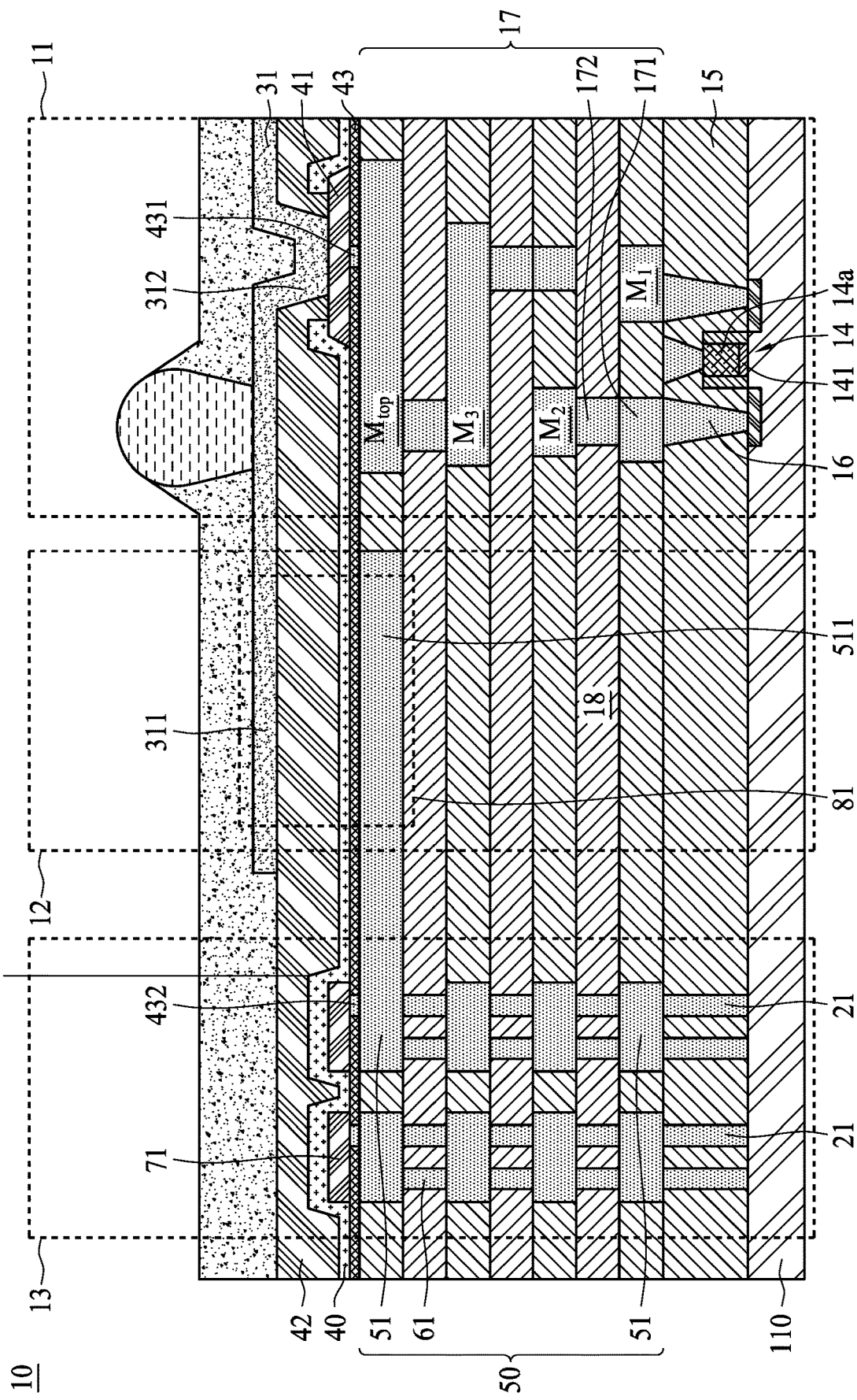
FIG. 7 is a cross-sectional view of a semiconductor structure according to some certain embodiments of the present disclosure.

Referring to FIG. 7 in conjunction with FIG. 1, a cross-sectional view is illustrated of another embodiment of semiconductor structure 10. Passivation layer 40 is formed over the seal ring structure 50 and the interconnect structure 17. Particularly, the passivation layer 40 is on a portion of the metal pad 41, a portion of conductive layer 51, a portion of metal layer $M_{top}$, and the IMD 18. In certain embodiments, the passivation layer 40 is formed of dielectric materials such as silicon nitride, silicon dioxide ($SiO_2$), phosphorus pentoxide ($P_4O_{10}$), selenium dioxide ($SeO_2$), sulfur trioxide ($SO_3$) or metal oxide. Examples of the metal oxide are selected from zinc oxide (ZnO), aluminium oxide ($Al_2O_3$), iron (II,III) oxide ($Fe_3O_4$), calcium oxide (CaO), ruthenium tetroxide ($RuO_4$), osmium (VIII) oxide ($OsO_4$), iridium tetroxide ($IrO_4$), indium tin oxide ($In_2O_3:S_nO_2$), xenon tetroxide ($XeO_4$), nickel oxide, titanium oxide, hafnium oxide, zirconium oxide, tungsten oxide, tantalum oxide, molybdenum oxide and copper oxide.

In some embodiments, the dielectric layer 42 is over the passivation layer 40 and covers a portion of the metal pad 41. Both of the passivation 40 and the dielectric layer 42 are patterned in order to have a recess to expose a portion of the metal pad 41. The exposed metal pad 41 serves as an electrical contact between the device 14 and other conductive trace, for example, a post passivation interconnect (PPI) 31. In addition, the dielectric layer 42 is also over the conductive pad 71 and the seal ring structure 50. In certain embodiments, the dielectric layer 42 is formed of a polymeric material such as epoxy, polyimide, benzocyclobutene (BCB), polybenzoxazole (PBO), and the like.

The PPI 31 is on the dielectric layer 42 and routes into the assembly isolation region 12 so as to be electrically coupled with the underlying current conducting trace 511, which is extended from the conductive layer 51. The extended portion 311 of PPI 31 and the extended portion 511 of the conductive layer 51 define an electric component 81. In some embodiments, the electric component 81 is a capacitor. The dielectric within the capacitor includes two layers, the passivation layer 40 and the dielectric layer 42, both of which are used to maintain the electrostatic field between the PPI 31 and the conductive layer 51.

In some embodiments, the PPI 31 extends into the recess of the passivation layer 40 and the dielectric layer 42. The extending portion 312 of the PPI 31 may line the bottom and sidewalls of the recess and electrically couple to the metal pad 41. In other words, the electric component 81 is electrically coupled to the device 14 through the underlying interconnect structure 17. In certain embodiments, the PPI 31 is formed of conductive material such as gold, silver, copper, nickel, tungsten, aluminum, and/or alloys thereof.

Figure 8:
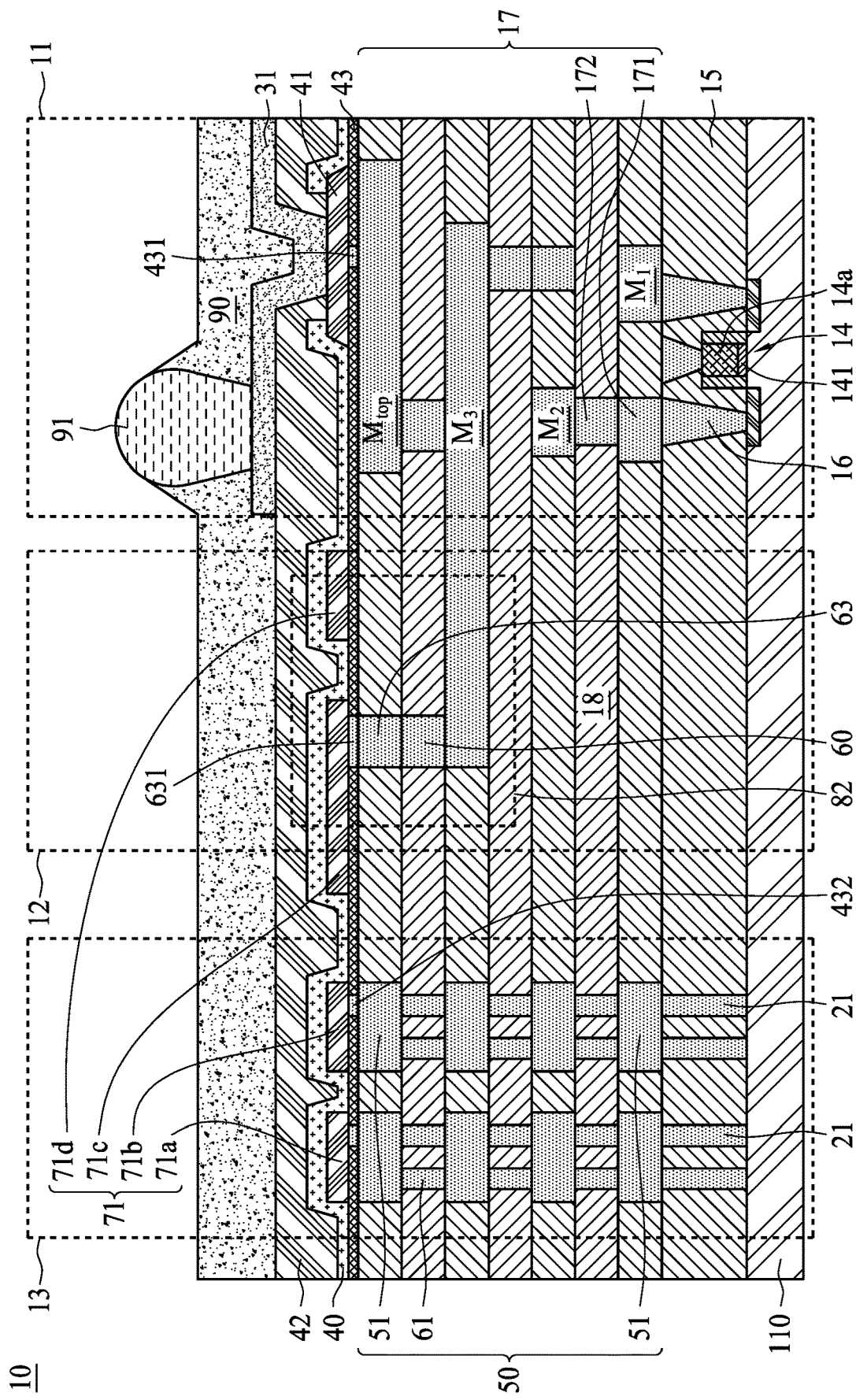
FIG. 8 is a cross-sectional view of a semiconductor structure according to alternative embodiments of the present disclosure.

Referring to FIG. 8 in conjunction with FIG. 1, a cross-sectional view is illustrated of another embodiment of semiconductor structure 10. Conductive pad 71 is distributed under a polymer layer 90, which surrounds a portion of the bump 91. The conductive pad 71 includes several segments, 71a, 71b, 71c and 71d. Segments 71a and 71b and are located in the seal ring region 13 and segments 71c and 71d are located in in the assembly isolation region 12. Segment 71a is at an exterior side above the seal ring structure 50 and closer to the chip edge or scribe line. Segment 71d is at an inner side of the assembly isolation region 12 and closer to the circuit region 11.

Figure 9:
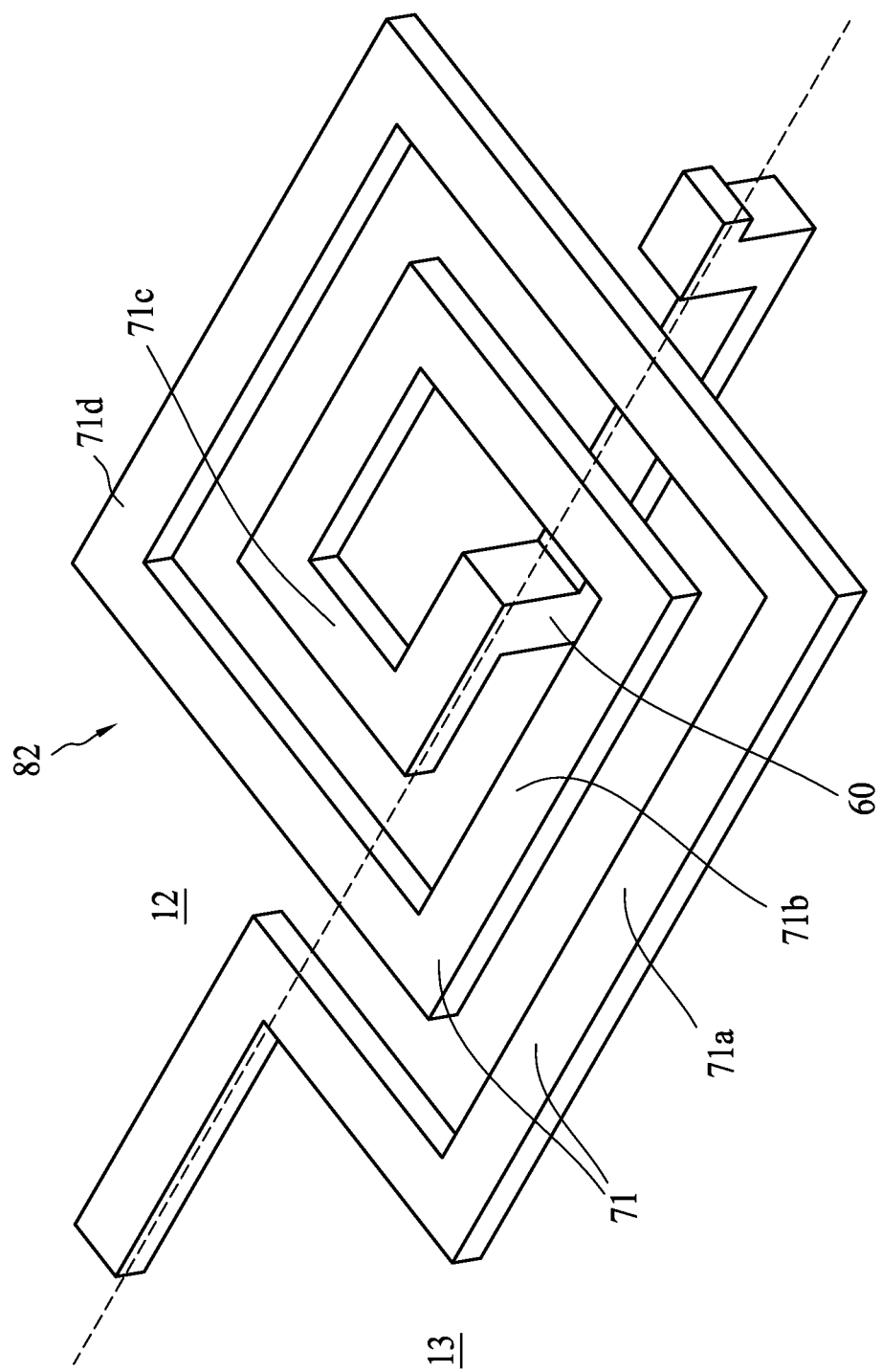
FIG. 9 is a schematic view of a semiconductor structure according to the embodiment of FIG. 8.

The semiconductor structure 10 further includes a conductive via 631 and a conductive feature 63, which is formed at the same layer with the top conductive layer 51 and the metal layer $M_{top}$. The conductive feature 63 is electrically connected to the conductive pad 71 through the conductive via 631, which is within the dielectric layer 43. A conductive layer $M_3$ extends into the assembly isolation region 12. A contact via 60 is electrically connected between the conductive structure 63 and the conductive layer $M_3$ so as to form an electric component, such as an inductor. In this case, the conductive pad 71 is patterned in an inductor configuration such as a coil or a spiral as shown in FIG. 9. In some embodiments, the conductive layer 51 and/or the conductive layer $M_3$ are extended into the assembly isolation region 12 to form a dual coil structure in a same layer.

A method for manufacturing a semiconductor structure, which includes several electric components in the assembly isolation region, is designed for extending the number of electric components around the die. The method includes a number of operations and the description and illustrations are not deemed as a limitation as the order of the operations.

Figure 10:
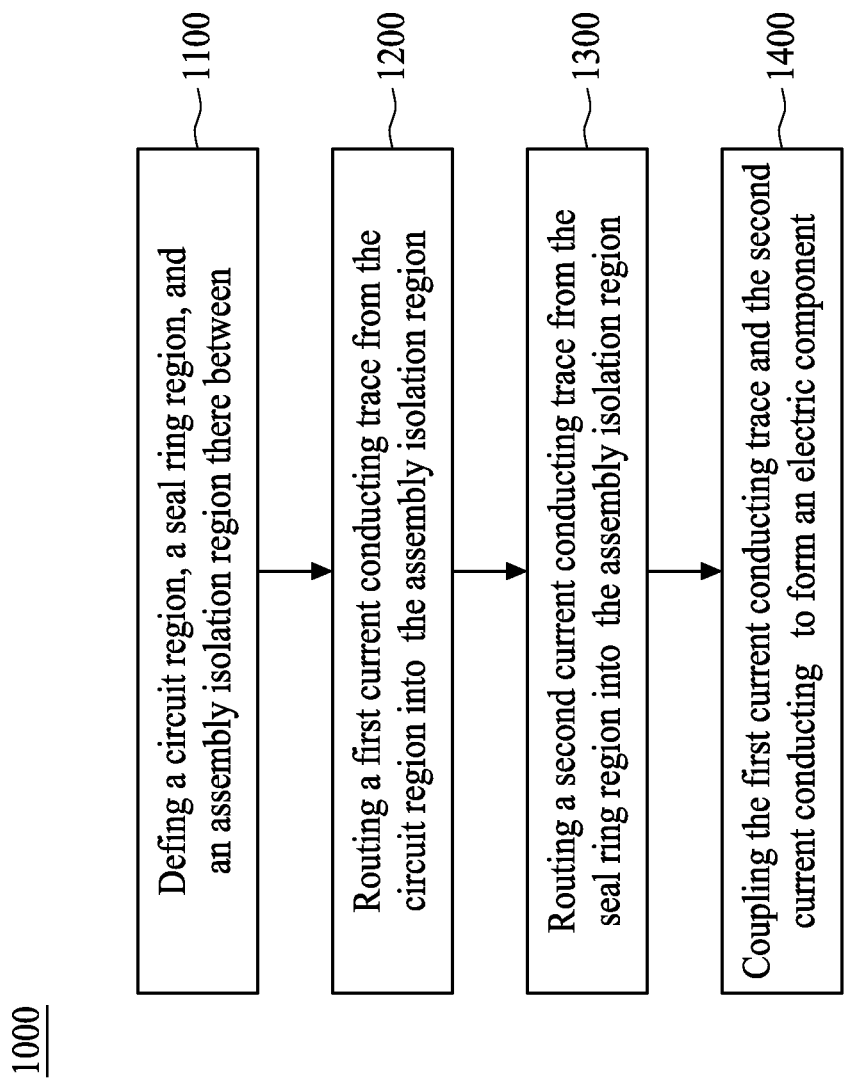
FIG. 10 is a flowchart of a method in fabricating a semiconductor structure according to some embodiments of the present disclosure.

FIG. 10 is a diagram of a method 1000 for fabricating a semiconductor structure in accordance with some embodiments of the present disclosure. The method 1000 includes several operations, which are discussed in detail with reference to FIGS. 5 to 19. At operation 1100, a circuit region, a seal ring region and an assembly isolation region are defined, wherein the assembly isolation region is between the circuit region and the seal ring region. At operation 1200, a first current conducting trace is routed from the circuit region into the assembly isolation region. At operation 1300, a second current conducting trace is routed from the seal ring region into the assembly isolation region. At operation 1400, the first current conducting trace and the second current conducting trace are coupled to form an electric component.

FIGS. 11 to 19 have been simplified for a better understanding of the inventive concepts of the present disclosure. In FIGS. 11 to 19, elements with same labeling numbers as those in FIGS. 1 to 9 are previously discussed with reference thereto and are not repeated here for simplicity.

Figure 11:
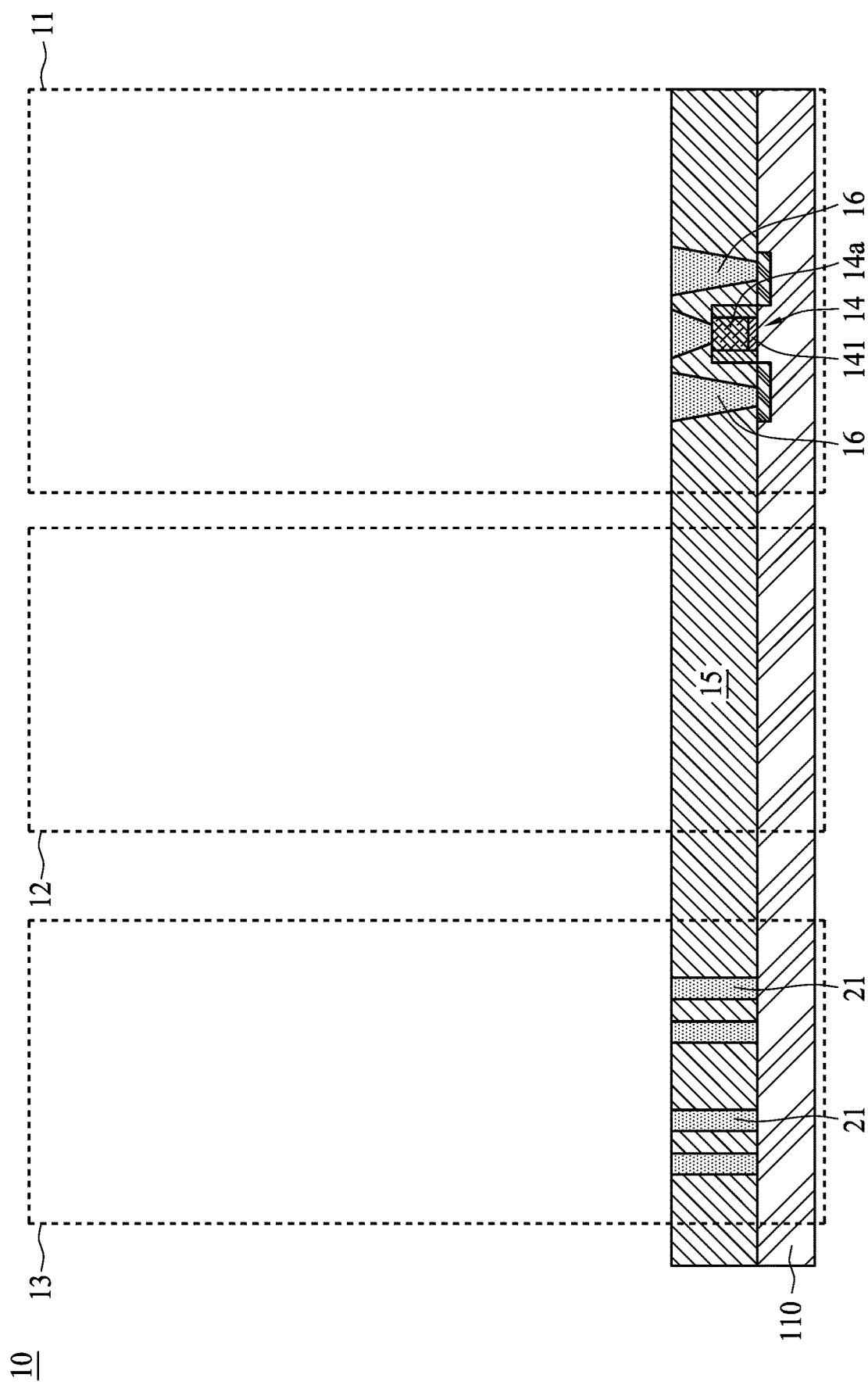
FIGS. 11 to 19 are cross-sectional views corresponding to various operations 1100 to 1400 in FIG. 10.

Referring to FIG. 11, semiconductor substrate 110 with the device 14 is received. The inter-layer dielectric (ILD) 15 is formed on the semiconductor substrate 110 through any suitable techniques such as a high aspect ratio process (HARP) and/or a high density plasma (HDP) CVD operation. The contact plugs 16 and the contact bars 21 are formed in the ILD 15 in order to be electrically coupled to conductive features (not shown). In certain embodiments, the formation of the contact plugs 16 and the contact bars 21 includes, for example, etching ILD 15 to form openings through a mask layer, and filling a conductive material into the openings. A planarization may then be performed to remove excess conductive material over ILD 15, and the remaining conductive material in the openings forms the contact plugs 16 and the contact bars 21. The region where the contact plugs 16 locate is defined as the circuit region 11 and the region where the contact bars locate is defined as the seal ring region. In addition, the assembly isolation region 12 is defined between the circuit region 11 and the seal ring region 13.

Figure 12:
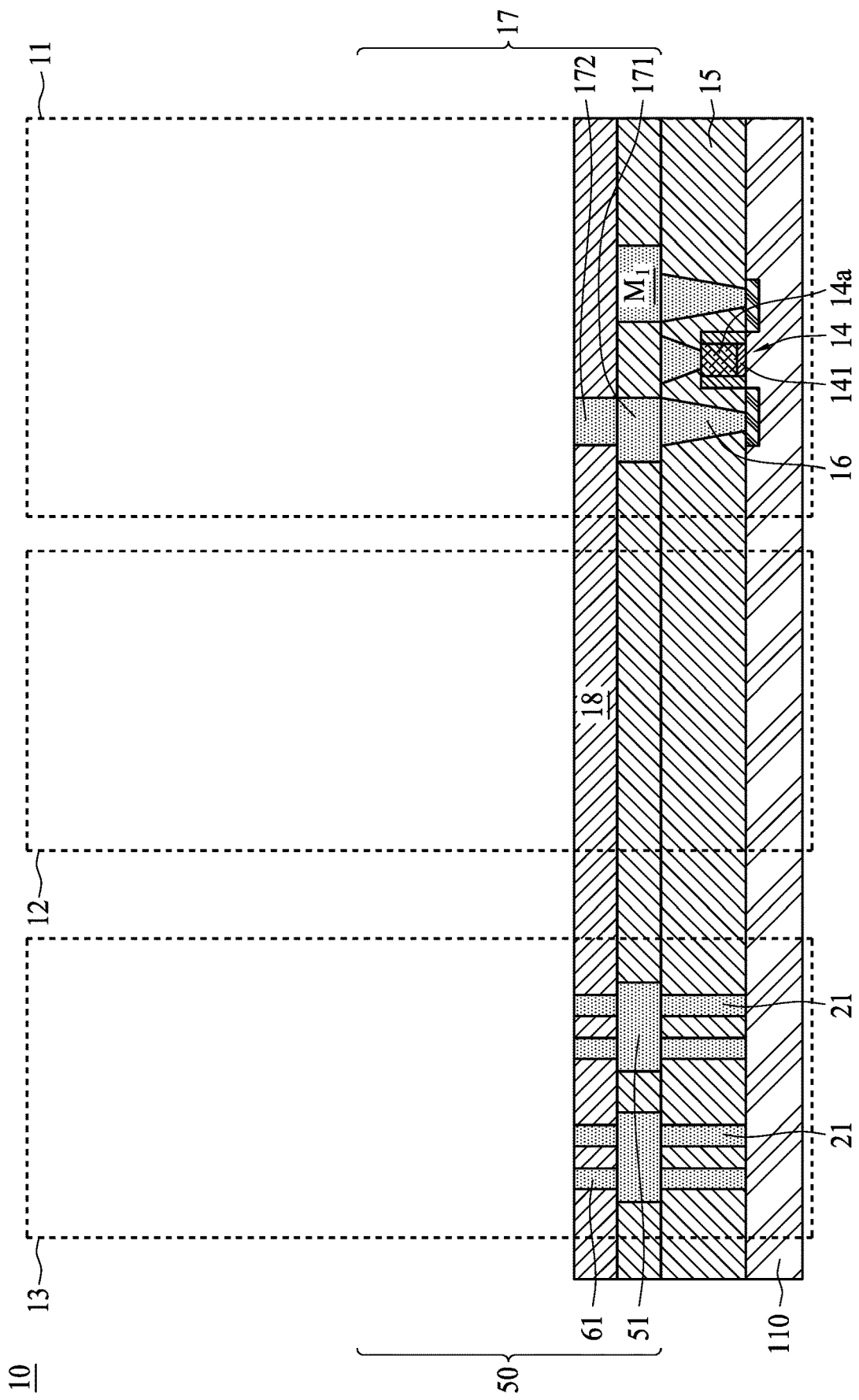

Referring to FIG. 12, a conductive layer is blanket deposited on ILD 15. The conductive layer may include at least one film and be formed by deposition such as sputtering, vaporization, or other suitable methods. In some embodiments, a hybrid deposition method including CVD (Chemical Vapor Deposition) and PVD (Physical Vapor Deposition) is introduced for the deposition. Subsequently, by using conventional photolithography, patterning, and etching techniques, the conductive layers $M_1$ and 51 are patterned in the circuit region 11 and the seal ring region 13, respectively. And then, the inter-metal dielectrics (IMDs) 18 are formed on the conductive layers $M_1$ and 51 through any suitable techniques such as a high aspect ratio process (HARP) and/or a high density plasma (HDP) CVD operation. Next, vias 172 and via layers 61 formed in the IMDs 18 are electrically coupled to the contact plugs 16 and the contact bars 21, respectively. In certain embodiments, the formation of the vias 172 and the via layers 61 includes, for example, etching IMDs 18 to form openings through a mask layer, and filling a conductive material into the openings. A planarization may then be performed to remove excess conductive material over IMDs 18, and the remaining conductive material in the openings forms the vias 172 and the via layers 61.

Figure 13:
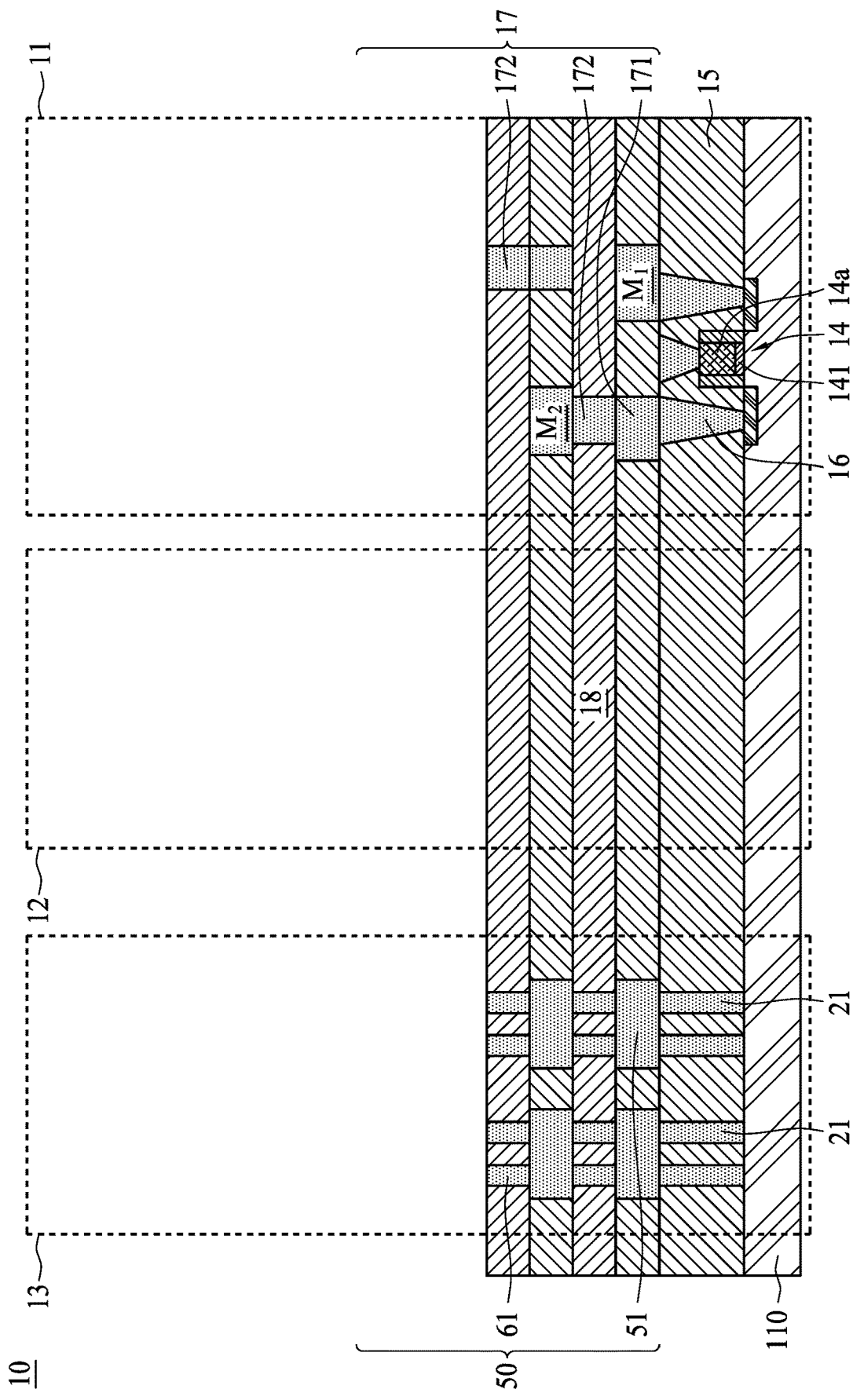

Referring to FIG. 13, similarly, another conductive layer $M_2$ and 51 and another via 172 and via layer 61 are formed as previously discussed so as to fabricate a part of the interconnect structure 17 and the seal ring structure 50, respectively.

Figure 14:
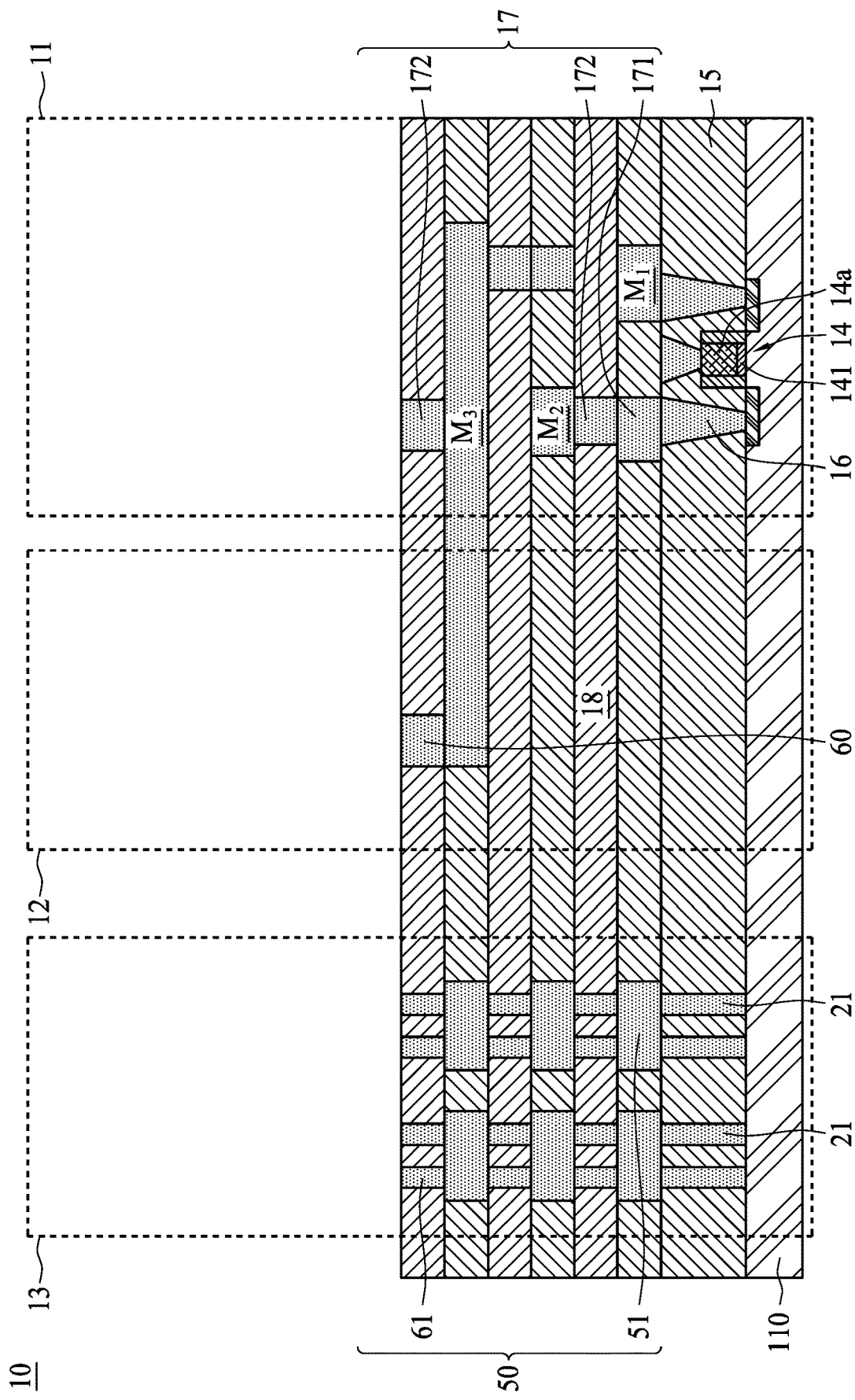

Referring to FIG. 14, a current conducting trace of the conductive layer $M_3$ routing from the circuit region 11 into the assembly isolation region 12 is formed by the previously mentioned operations such as metal deposition, photolithography, patterning, and etching techniques. In addition, the contact via 60 is formed in the assembly isolation region 12 and the via 172 and via layer 61 are simultaneously formed in the circuit region 11 and the seal ring region 13. The contact via 60, the via 172 and the via layer 61 are formed by the previously identified operations such as etching, metal depositing, and chemical mechanical polishing techniques.

Figure 15:
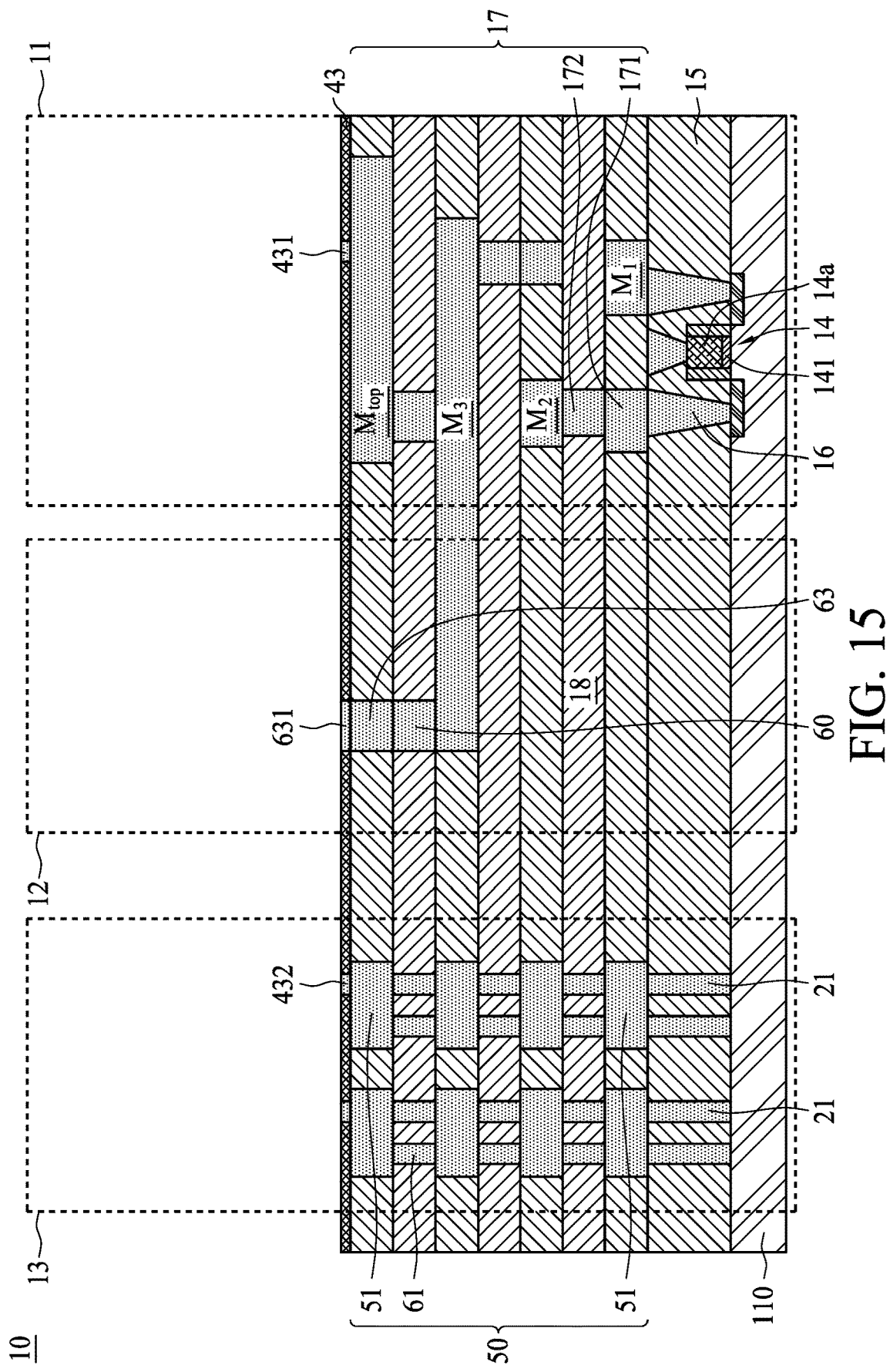

Referring to FIG. 15, the conductive feature 63 and the conductive via 631 in the assembly isolation region 12 are formed by the previously discussed operations such as metal deposition, photolithography, patterning, and etching techniques. The conductive feature 63 is electrically connected with the contact via 60 in the assembly isolation region 12. In some embodiments, the contact via 60 and the conductive via 631 are optional. Without the contact via 60 and the conductive via 631, the conductive layer $M_3$ is still capable of forming other type of the electric component such as a capacitor.

Figure 16:
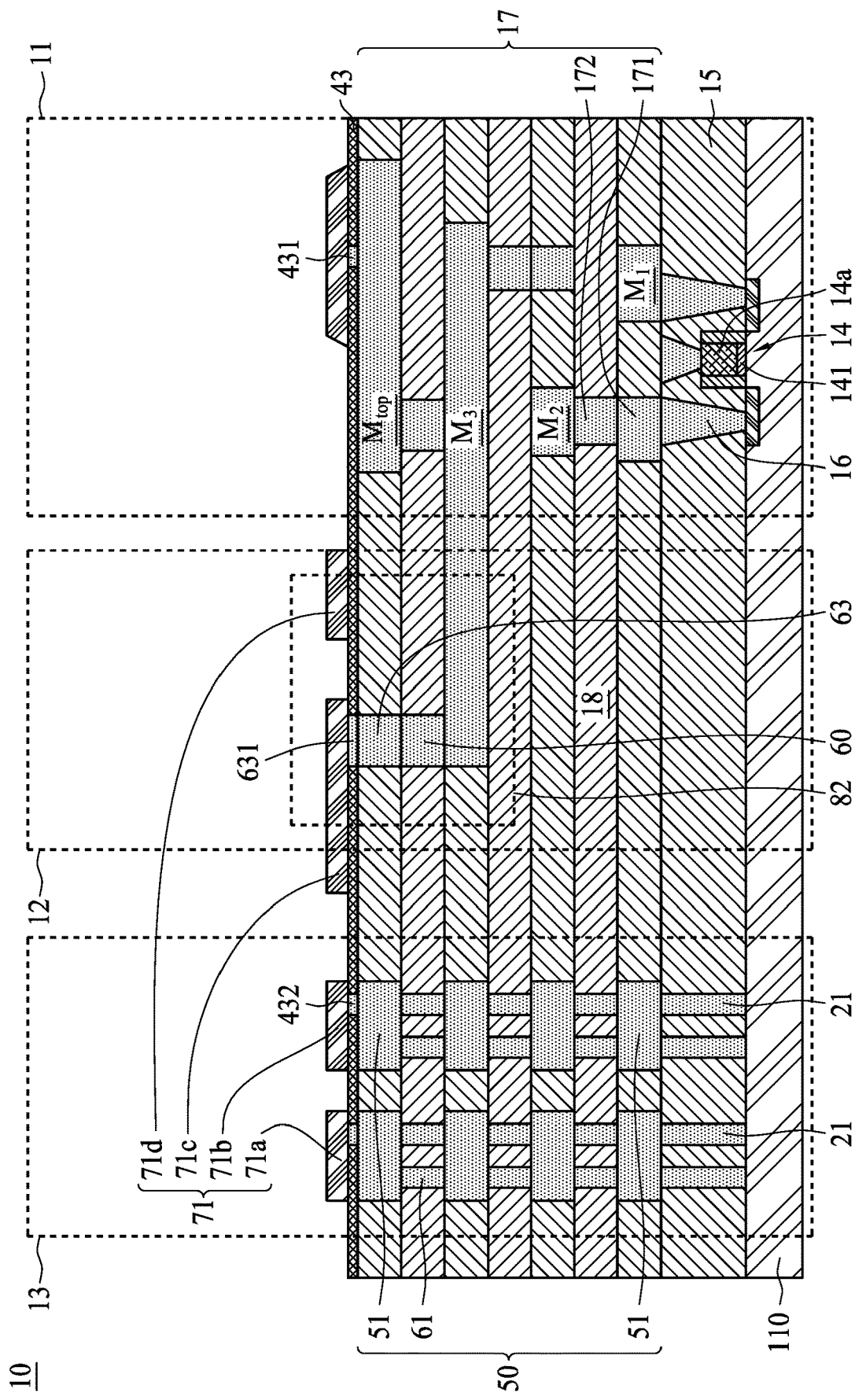
Figure 17:
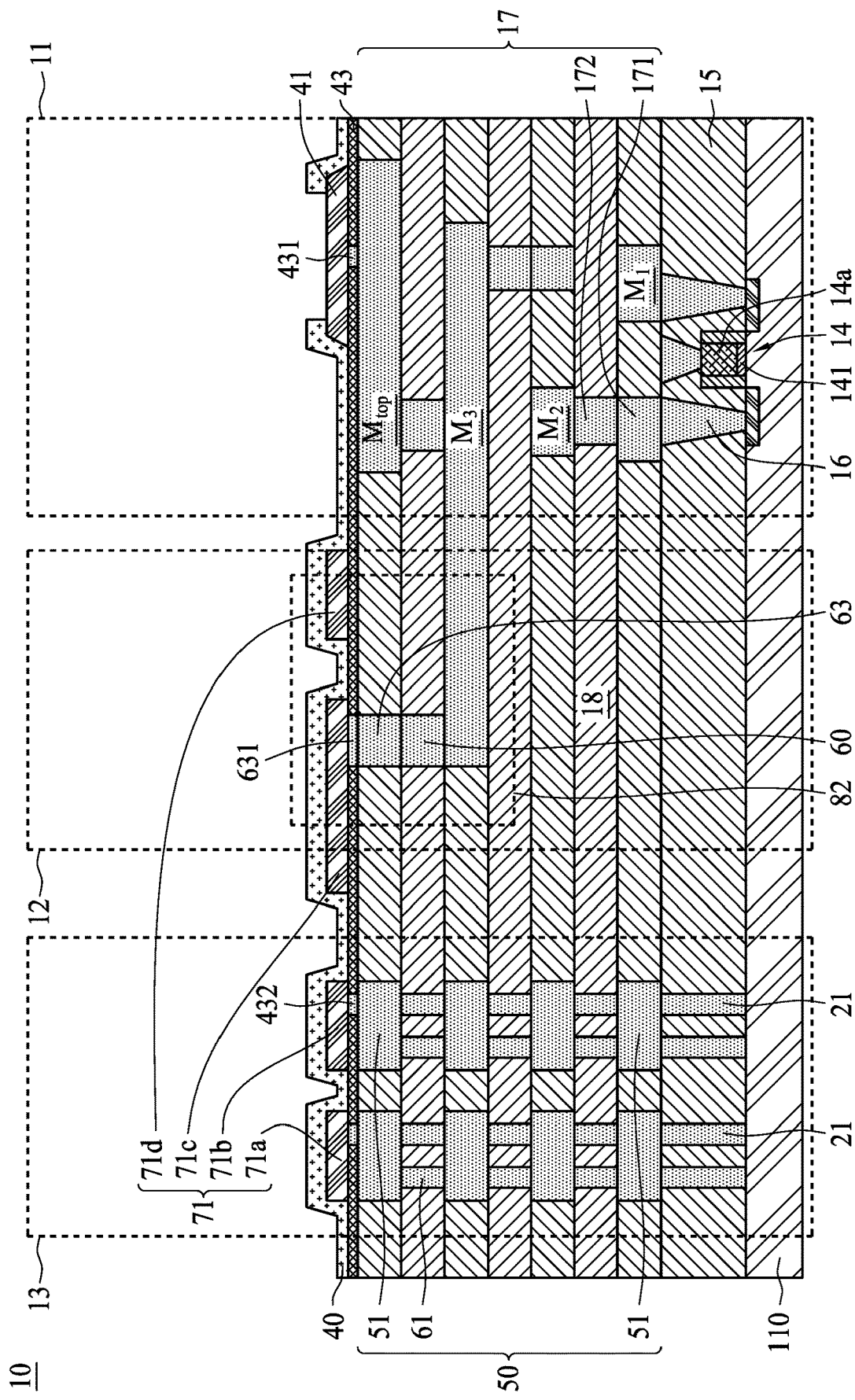

Referring to FIG. 16, the top metal pad 41 and the conductive pad 71 are patterned over the interconnect structure 17 and the seal ring structure 50 by using conventional photolithography, patterning, and etching techniques. The pattern of the conductive pad 71 includes several segments, 71a, 71b, 71c, and 71d as illustrated in FIG. 9. The conductive pad 71 is electrically connected to the interconnect structure 17 through the conductive feature 63, the contact via 60 and the conductive via 631 so as to form an electric component 82, such as an inductor Referring to FIG. 17, the passivation layer 40 is deposited by any suitable techniques such as a high aspect ratio process (HARP) and/or a high density plasma (HDP) CVD operation. In addition, a portion of the passivation layer 40 is removed by using photolithography with a photoresist layer and etching techniques. The photolithography operation may include spin-coating, soft-baking, exposure, post-backing, developing, rinsing, drying and other suitable operation.

Figure 18:
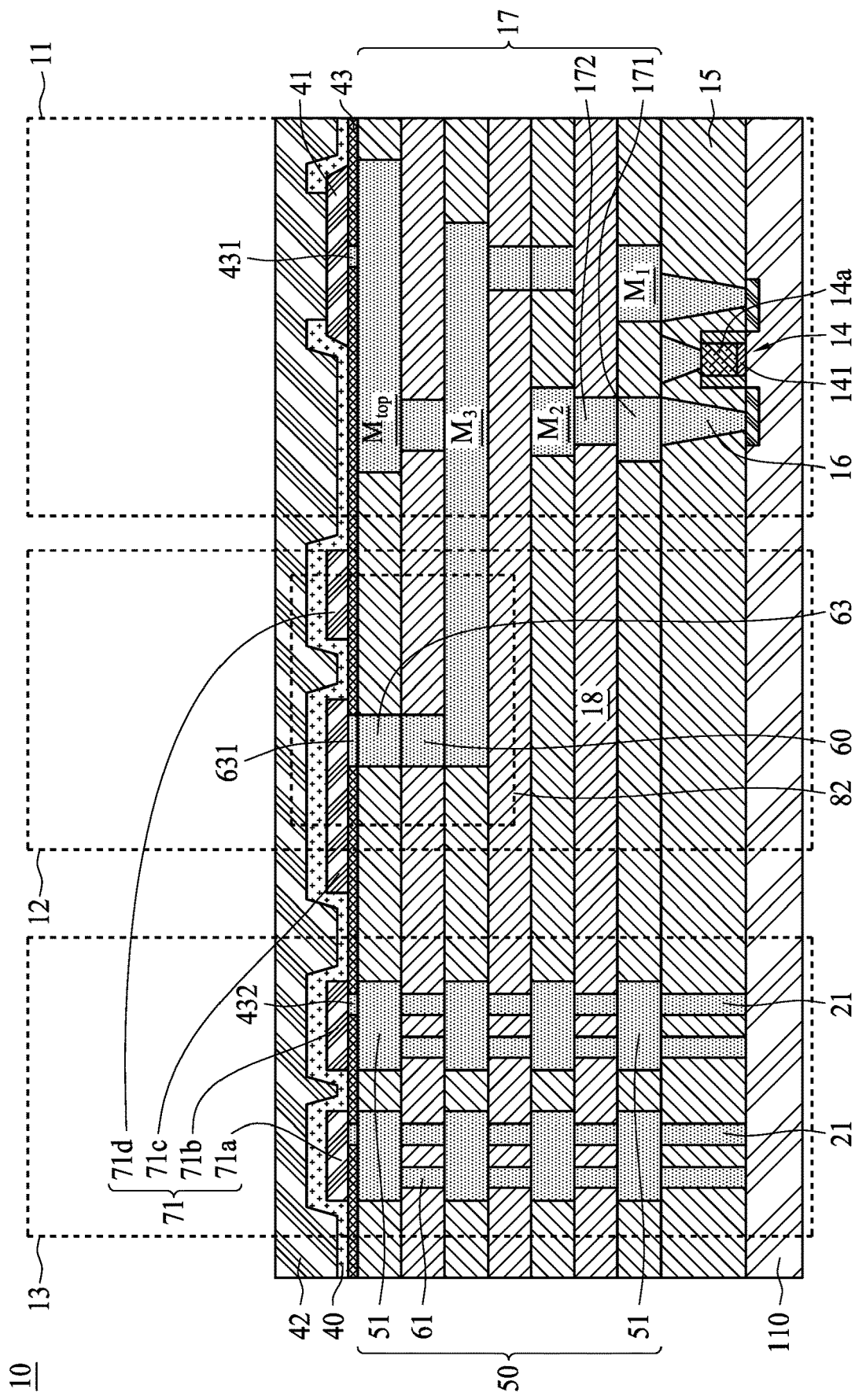

Referring to FIG. 18, the dielectric layer 42 is disposed on the passivation layer 40 by using spin-coating techniques. A portion of the dielectric layer 42, atop the pad 41, is removed to form a recess in subsequent operations. The removing operation may be implemented by exposure, developing, rinsing, drying and other suitable operations.

Figure 19:
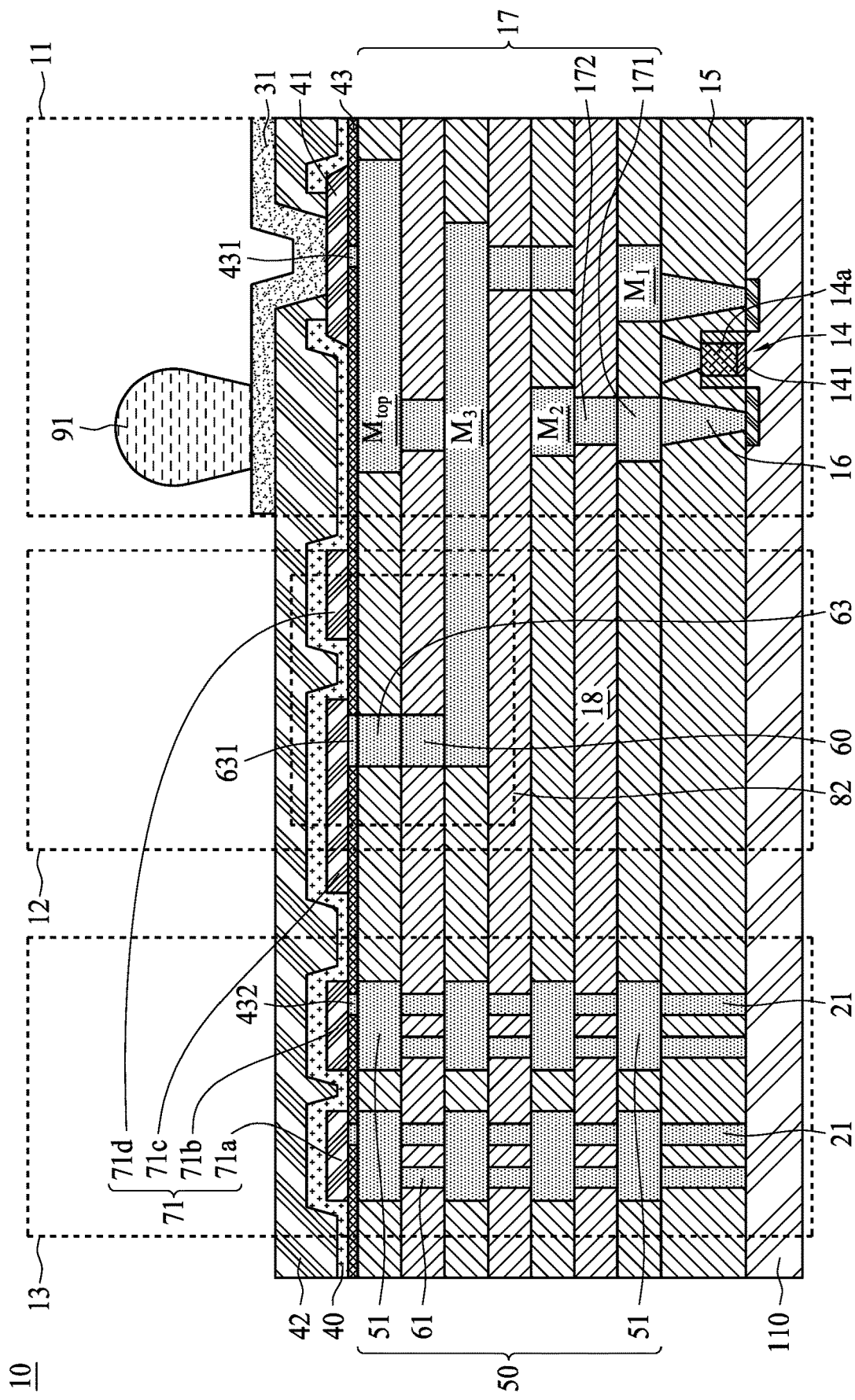

Referring to FIG. 19, the PPI 31 is disposed on the dielectric layer 42 and the recess to form an electrical connection with the metal pad 41. The bump 91 is located on a portion of the PPI 31 by traditional bump-planting techniques. Subsequently, after the polymer layer 90 covers the dielectric layer 42, the PPI 31 and a portion of the bump 91 through spin-coating techniques, the semiconductor structure 10 as previously shown in FIG. 8 is completed.

In some embodiments, a semiconductor structure includes a circuit region, a seal ring region and an assembly isolation region. The circuit region includes a first conductive layer. The seal ring region includes a second conductive layer. The assembly isolation region is between the circuit region and the seal ring region. The first conductive layer and the second conductive layer respectively includes a portion extending into the assembly isolation region thereby forming an electric component in the assembly isolation region.

In some embodiments, a semiconductor structure includes a circuit region, and a seal ring region. The seal ring region surrounds the circuit region and is separated from the circuit region by an assembly isolation region. The first current conducting trace is in the circuit region and a second current conducting trace is in the seal ring region. The first current conducting trace and the second current conducting trace respectively extend into the assembly isolation region and mutually form an electric component.

In some embodiments, a method for fabricating a semiconductor structure includes defining a circuit region, a seal ring region, and an assembly isolation region between the circuit region and the seal ring region. The method also includes routing a first current conducting trace from the circuit region into the assembly isolation region. The method also includes routing a second current conducting trace from the seal ring region into the assembly isolation region. The method also includes coupling the first current conducting trace and the second current conducting trace to form an electric component.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or". In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising".

What is claimed is:

1. A semiconductor structure, comprising:
a substrate;
a circuit region over the substrate, comprising a device having a gate layer;
a seal ring region over the substrate and surrounding the circuit region, comprising a seal ring structure having a first conductive layer; and
an assembly isolation region between the circuit region and the seal ring region, the first conductive layer extends from the seal ring region to the assembly isolation region;
wherein a portion of the gate layer extends into the assembly isolation region, the portion of the gate layer vertically overlaps with the portion of the first conductive layer in a plan view, thereby forming a first electric component, and the gate layer has a uniform thickness across the substrate.

2. The semiconductor structure of claim 1, further comprising a first dielectric between the portion of the first conductive layer and the portion of the gate layer.

3. The semiconductor structure of claim 1, wherein the gate layer has a uniform lower surface.

4. The semiconductor structure of claim 2, wherein the gate layer further comprising a second dielectric different from the first dielectric.

5. The semiconductor structure of claim 1, further comprising a second conductive layer in the circuit region and electrically connected to the gate layer.

6. The semiconductor structure of claim 1, wherein the portion of the first conductive layer is above the portion of the gate layer in the assembly isolation region.

7. The semiconductor structure of claim 1, wherein the gate layer comprises a conductive portion and an insulating portion.

8. The semiconductor structure of claim 7, wherein the conductive portion of the gate layer comprises polysilicon.

9. The semiconductor structure of claim 7, wherein the insulating portion comprises high-k dielectric layer.

10. A semiconductor structure, comprising:
a substrate;
a circuit region, comprising a gate structure having a conductive portion and an insulator portion over the substrate,
a seal ring region surrounding the circuit region, comprising a seal ring structure having a first current conducting trace; and
an assembly isolation region, separating the seal ring region and the circuit region,
wherein a portion of the first current conducting trace of the seal ring structure extending into the assembly isolation region couples with a portion of the gate structure of the circuit region extending into the assembly isolation region, thereby forming a first electric component.

11. The semiconductor structure of claim 10, wherein the gate structure comprises a semiconductive material.

12. The semiconductor structure of claim 10, further comprising a second current conducting trace in the circuit region, electrically coupling with the gate structure.

13. The semiconductor structure of claim 10, wherein the gate structure extends into the assembly isolation region.

14. The semiconductor structure of claim 11, wherein the first electric component comprises a capacitor.

15. The semiconductor structure of claim 10, wherein the insulator portion of the gate structure comprises high-k dielectric.

16. A method for manufacturing a semiconductor structure, comprising:
defining a circuit region, a seal ring region, and an assembly isolation region between the circuit region and the seal ring region over a substrate;
routing a first current conducting trace over the substrate from the circuit region into the assembly isolation region;
forming a seal ring structure surrounding the circuit region, wherein the seal ring structure comprises a second current conducting trace extending from seal ring region into the assembly isolation region, wherein the first current conducting trace is a semiconductive material of a circuit element;
wherein a portion of the first current conducting trace in the assembly isolation region vertically overlaps with a portion of the second current conducting trace in the assembly isolation region from a plan view, thereby forming a first electric component, and the portion of the second current conducting trace is above the portion of the first current conducting trace in the assembly region.

17. The method of claim 16, further comprising forming an inter dielectric layer between the first current conducting trace and the second current conducting trace.

18. The method of claim 16, wherein routing the first current conducting trace comprises pattering a polysilicon layer over the substrate.

19. The semiconductor structure of claim 1, wherein the first electric component comprises a capacitor.

20. The method of claim 16, wherein the first electric component comprises a capacitor.

* * * * *